United States Patent
Sheeley et al.

(10) Patent No.: US 12,045,591 B2
(45) Date of Patent: Jul. 23, 2024

(54) SKIP BUFFER SPLITTING

(71) Applicant: SambaNova Systems, Inc., Palo Alto, CA (US)

(72) Inventors: Nathan Sheeley, Austin, TX (US); Weihang Fan, Palo Alto, CA (US); Matheen Musaddiq, Austin, TX (US); Ram Sivaramakrishnan, San Jose, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 121 days.

(21) Appl. No.: 17/944,872

(22) Filed: Sep. 14, 2022

(65) Prior Publication Data
US 2023/0385043 A1 Nov. 30, 2023

Related U.S. Application Data

(60) Provisional application No. 63/345,751, filed on May 25, 2022.

(51) Int. Cl.
*G06F 8/41* (2018.01)
*G06F 3/06* (2006.01)

(52) U.S. Cl.
CPC ............ *G06F 8/452* (2013.01); *G06F 3/0604* (2013.01); *G06F 3/0635* (2013.01); *G06F 3/0656* (2013.01); *G06F 3/0673* (2013.01); *G06F 3/0683* (2013.01)

(58) Field of Classification Search
None
See application file for complete search history.

(56) References Cited

U.S. PATENT DOCUMENTS

| | | | |
|---|---|---|---|
| 6,983,456 B2 * | 1/2006 | Poznanovic | G06F 30/30 |
| | | | 717/133 |
| 11,237,880 B1 * | 2/2022 | Raumann | G06F 9/544 |

(Continued)

OTHER PUBLICATIONS

Hannig, "Mapping of Regular Nested Loop Programs to Coarse-grained Reconfigurable Arrays—Constraints and Methodology", 2004, IEEE (Year: 2004).*

(Continued)

*Primary Examiner* — Hossain M Morshed
(74) *Attorney, Agent, or Firm* — Flagship Patents; Sikander M. Khan; Andre Henri Grouwstra

(57) ABSTRACT

A compiler transforms a high-level program into configuration data for a coarse-grained reconfigurable (CGR) data processor with an array of CGR units. The compiler includes a method that identifies a skip buffer in a dataflow graph, determines limitations associated with the array, and searches for a lowest cost implementation topology and stage depth. At least three topologies are considered, including a cascaded buffer topology, a hybrid buffer topology, and a striped buffer topology. The lowest cost implementation topology and stage depth are based on the size of the buffered data (usually, the size of a tensor), the depth of the skip buffer, and the array's limitations. The hybrid buffer topology includes multiple sections of parallel memory units. The data travels between memory units in one section to adjacent memory units in a next section without intervening reorder buffers.

6 Claims, 10 Drawing Sheets

(56) References Cited

U.S. PATENT DOCUMENTS

| | | | | |
|---|---|---|---|---|
| 2010/0185839 | A1* | 7/2010 | Oh | G06F 8/451 |
| | | | | 712/E9.058 |
| 2023/0134744 | A1* | 5/2023 | Leung | G06F 9/52 |
| | | | | 718/106 |
| 2023/0297349 | A1* | 9/2023 | Deng | G06F 15/7878 |
| | | | | 717/155 |
| 2023/0305842 | A1* | 9/2023 | Windh | G06F 9/44505 |
| 2023/0315411 | A1* | 10/2023 | Wang | G06F 8/452 |
| | | | | 717/155 |
| 2023/0385043 | A1* | 11/2023 | Sheeley | G06F 3/0635 |

OTHER PUBLICATIONS

Abdin, "Occam-pi as a High-level Language for Coarse-Grained Reconfigurable Architectures", 2015, ResearchGate (Year: 2015).*

* cited by examiner (For FIG. 2, see next page)

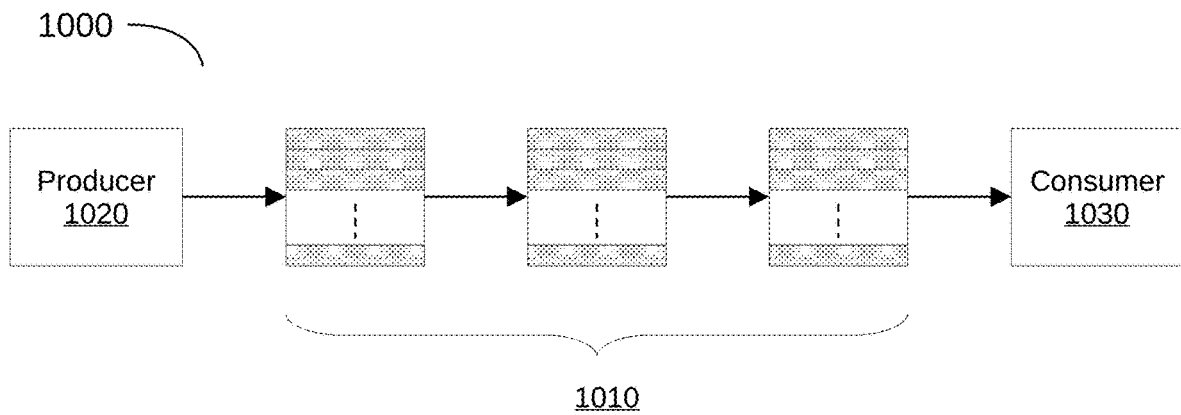
Pros:
- No reorder buffer (fewer memory units in case of small buffers)
- Low fan-in
- Low fan-out
Cons:
- More copies of tensor data, higher bandwidth requirement
- Hardware limit on buffer size
- Extra copy of tensor for each cascade
FIG. 10 - Cascaded buffer
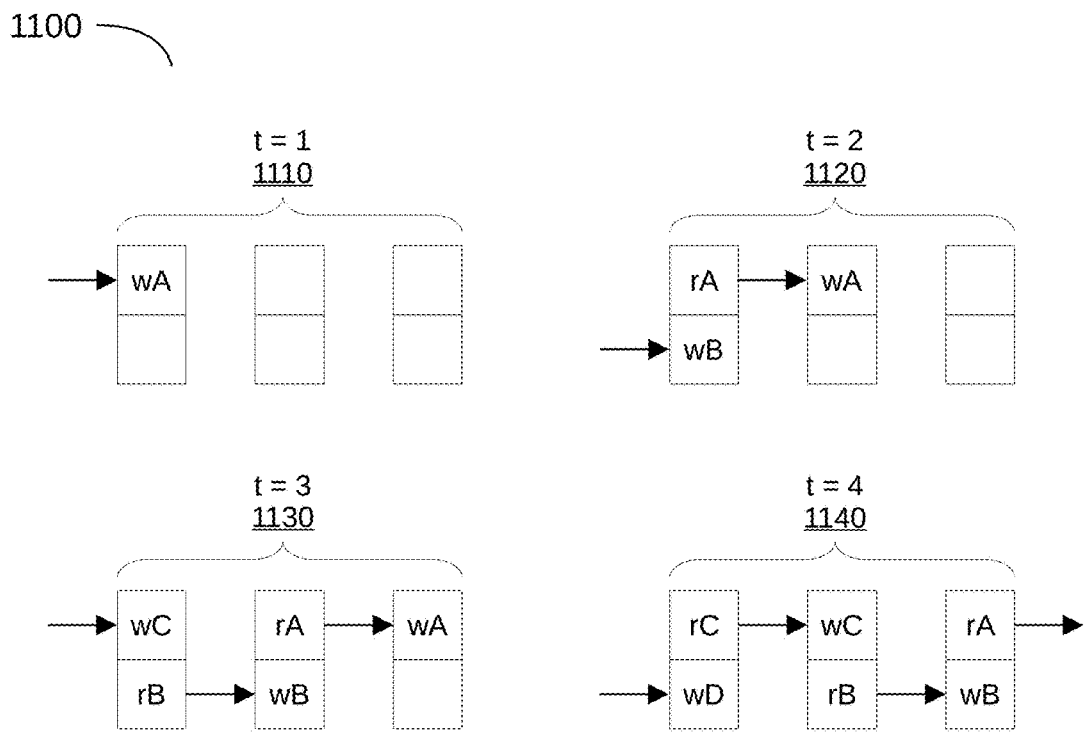
FIG. 11 - Data movement

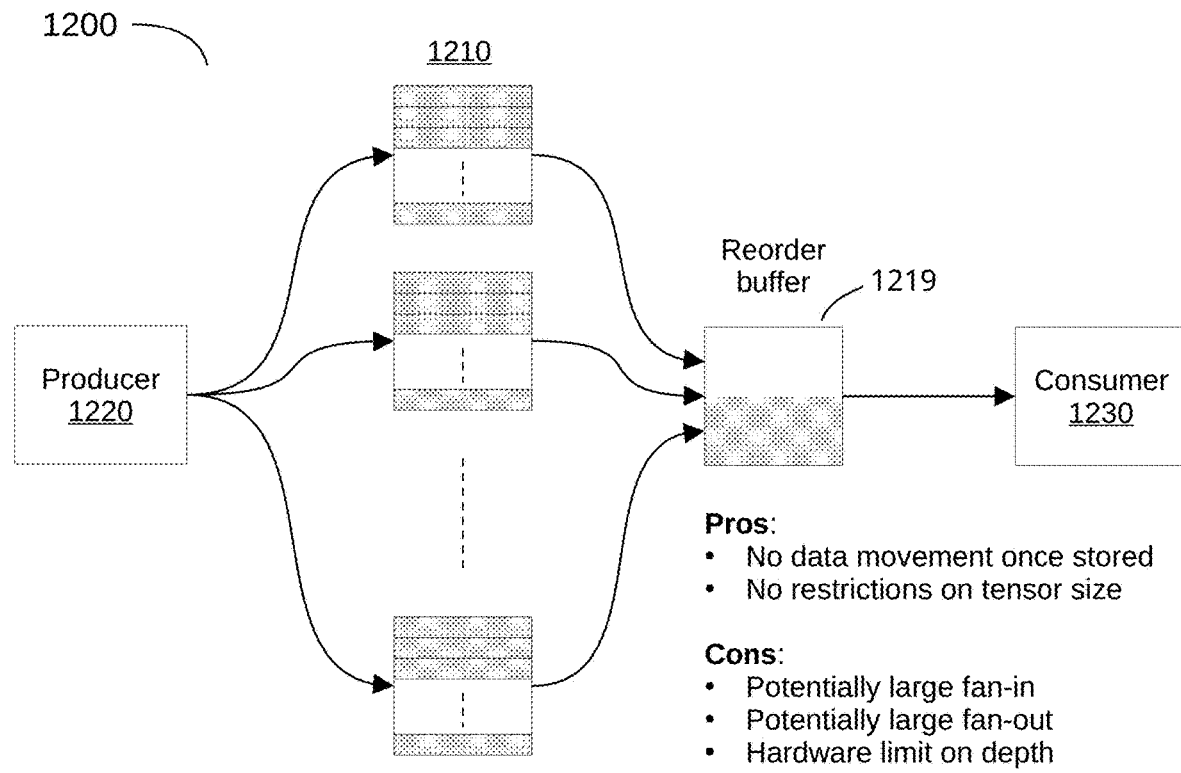
FIG. 12 - Striped buffer
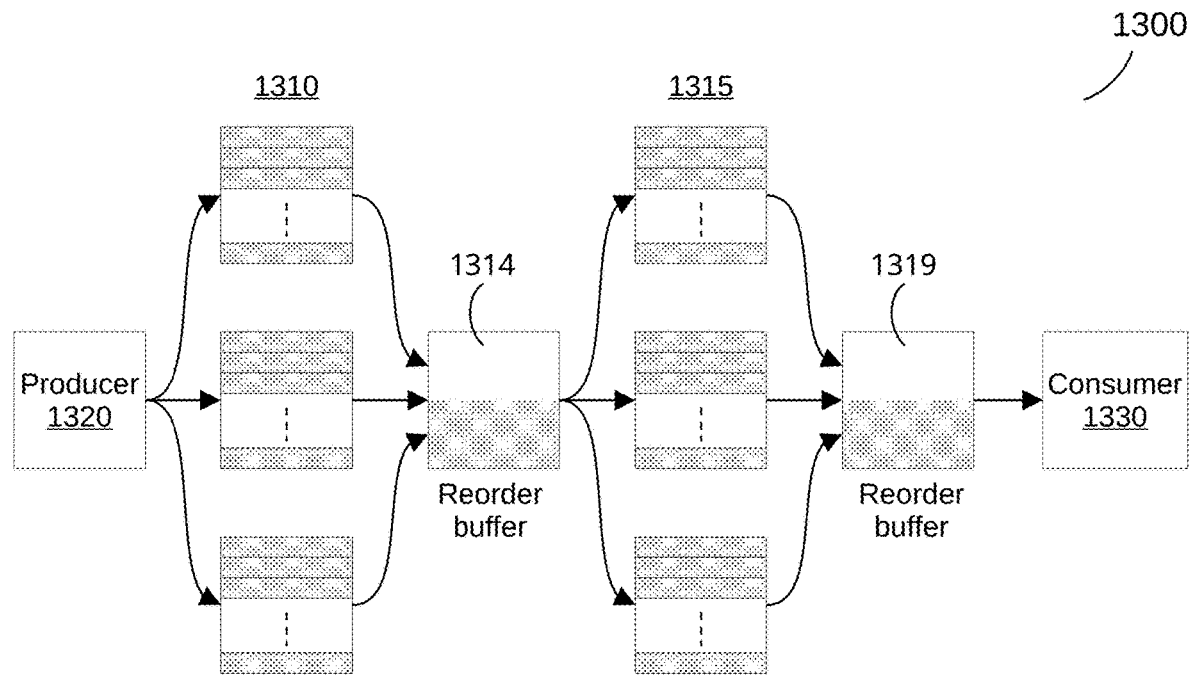
FIG. 13 - Hybrid buffer

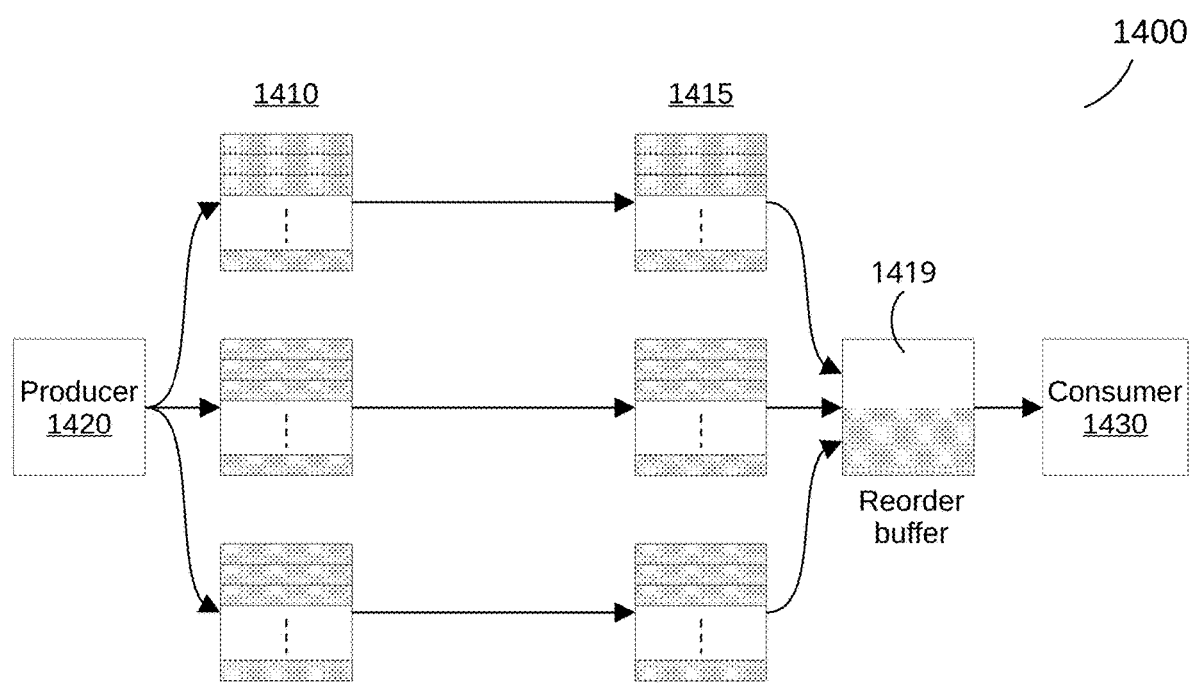
FIG. 14 - Hybrid buffer

```
1   count_fanin_fanout(Buffer, info)
2     // Total number of memory units, plus fanout to consumer (1 if no ROB, 2 if ROB)
3     // Varies based on buffer implementation, current optimization
4
5   count_copies(Buffer, info, fanin, fanout)
6     // The number of times a tensor has to be written
7     // Varies based on buffer topology, current optimization
8
9   count_pmus(Buffer, info)
10    // Varies based on buffer topology, current optimization
11
12  get_section_depths_for_split(target_depth, split_depth)
13    // The depth for each section
14    // Each section needs 1 extra depth to avoid stalling its upstream provider
15    effective_depth = split_depth - 1;
16    // Subtract 1 from target_depth since last buf counts effective_depth + 1
17    info.full_section_bufs = floor((target_depth - 1) / effective_depth)
18    full_effective_depth = info.full_section_bufs * effective_depth;
19    // Add 1 to full_effective_depth since last buf counts effective_depth + 1
20    info.partial_section_bufs = split_depth < target_depth &&
21                     target_depth > (full_effective_depth + 1);
22    if (info.partial_section_bufs)
23       info.partial_depth = target_depth - full_effective_depth;
24    else
25       info.partial_depth = 0;
26    return info
27
28  pick_split(Buffer)
29    depth_per_pmu = floor(BYTES_PER_PMU / Buffer.bytes_per_tensor())
30    start_depth = min(depth_per_pmu, Buffer.depth(), SKIP_BUFFER_MAX_DEPTH)
31    start_depth = max(2, start_depth) // need at least double buffer
32    end_depth = min(Buffer.depth(), SKIP_BUFFER_MAX_DEPTH)
33    best_depth = -1
34    min_cost = UINT_MAX;
35    for (each_depth = start_depth; each_depth <= end_depth; each_depth++) {
36       info = get_section_depths_for_split(Buffer.depth(), each_depth)
37       fanin, fanout = count_fanin_fanout(Buffer, info)
38       // Limit fanin regardless of cost
39       if (best_depth != -1 && (fanin > SKIP_BUFFER_MAX_FANIN))
40          break;
41       num_copies = count_copies(Buffer, info, fanin, fanout)
42       num_pmus = count_pmus(Buffer, info)
43       cost = num_pmus * SKIP_BUFFER_PMU_WEIGHT +
44              num_copies * SKIP_BUFFER_COPIES_WEIGHT;
45       if (cost <= min_cost) {
46          min_cost = cost;
47          best_depth = each_depth;
48       }
49    }
50    return best_depth
```

FIG. 15

SKIP BUFFER SPLITTING

CROSS-REFERENCES AND INCORPORATIONS

This application claims the benefit of U.S. provisional patent application No. 63/345,751, entitled, "Buffer and Layout Optimizations," filed on 25 May 2022, which is hereby incorporated by reference for all purposes.

The following are incorporated by reference for all purposes:

Prabhakar et al., "Plasticine: A Reconfigurable Architecture for Parallel Patterns," *ISCA '17*, Jun. 24-28, 2017, Toronto, ON, Canada; and Koeplinger et al., "Spatial: A Language and Compiler for Application Accelerators," *Proceedings of the 39th ACM SIGPLAN Conference on Programming Language Design and Embodiment* (PLDI), Proceedings of the 43rd International Symposium on Computer Architecture, 2018.

BACKGROUND

Technical Field

The technology disclosed relates to compilers for reconfigurable architectures, and can be particularly applied to compiler logic for coarse-grain reconfigurable architectures and other distributed execution systems.

SUMMARY

Traditional compilers translate human-readable computer source code into machine code that can be executed on a Von Neumann computer architecture. In this architecture, a processor serially executes instructions in one or more threads of software code. The architecture is static and the compiler does not determine how execution of the instruction is pipelined, or which processor or memory takes care of which thread. Thread execution is asynchronous, and safe exchange of data between parallel threads is not supported.

High-level programs for machine learning (ML) and artificial intelligence (AI) require massively parallel computations, where many parallel and interdependent threads exchange data. Such programs are ill-suited for execution on Von Neumann computers. They require architectures that are optimized for parallel processing, such as coarse-grained reconfigurable architectures (CGRAs) or graphic processing units (GPUs). The ascent of ML, AI, and massively parallel architectures places new requirements on compilers, including how computation graphs, and in particular dataflow graphs, are pipelined, which operations are assigned to which compute units, how data is routed between various compute units and memory units, and how synchronization is controlled particularly when a dataflow graph includes one or more nested loops, whose execution time varies dependent on the data being processed.

The high-level programs may be developed on a popular machine-learning framework such as PyTorch or Tensor-Flow. To execute a high-level program, a compiler must first translate it to one or more processor-executable files that can be loaded into one or more processors that operate in tandem. The translation can take several intermediate steps, including translation to, or extraction of, one or more dataflow graphs, and refinements, additions, and optimizations to make the dataflow graphs suitable for the hardware on which they are to be executed, as well as assignment of the various graph elements to physical units and routing channels available in the processor(s). The assignment function is known as place and route (PNR).

The dataflow graphs may include multiple meta-pipelines (defined in the Terminology section) of parallel, interdependent operations. The meta-pipelines may include loops, and even nested loops, and operations may not have a fixed duration, so that the meta-pipelines run asynchronously. Thus, a dataflow compiler must resolve the asynchronous operation of the interdependent meta-pipelines, as well as synchronization within the meta-pipelines, and it must resolve PNR using the available hardware efficiently, without causing excessive dissipation, or loss of performance due to congestion of the routing channels used. Those functions are unknown in traditional compilers for von Neumann architecture computers.

One compiler task is to partition the dataflow graphs into pipeline stages of the meta-pipelines, and to insert stage buffers to separate the pipeline stages. In some cases, some data from a stage may be used not by a stage that immediately follows, but by a stage further downstream. Thus, the data must skip the operations of one or more stages, to which end it is stored in a so-called skip buffer.

In a first aspect, an implementation provides a method to transform a high-level program into a computer-readable file with configuration data for a reconfigurable data processor with an array of coarsely reconfigurable units. The method transforms at least a part of the high-level program into a dataflow graph. In the dataflow graph, it identifies a skip buffer. It determines limitations associated with the array of coarsely reconfigurable units. The limitations include the number of bytes in a memory unit, the maximum depth of a skip buffer, and the maximum fan-in of a skip buffer. The method searches for a lowest cost implementation topology. The implementation topology has one or more stages, each with an associated stage depth. The method also determines the lowest cost stage depth for the lowest cost implementation topology. At least three topologies are considered, including a cascaded buffer topology, a hybrid buffer topology, and a striped buffer topology. The lowest cost implementation topology and stage depth are based on the size of the buffered data (usually, the size of a tensor), the depth of the skip buffer, and the limitations. The implementation assigns the first buffer to memory units and communication channels according to the lowest cost implementation topology and stage depth, generates a computer-readable file with configuration data, and stores the computer-readable file in a non-transitory computer-readable storage medium.

The hybrid buffer topology includes multiple sets of parallel memory units. The data travels between memory units in one set of parallel memory units to adjacent memory units in a next set of parallel memory units without intervening reorder buffers.

In a second aspect, an implementation provides a non-transitory computer-readable storage medium with instructions that can execute the method described in the first aspect on a computer processor.

In a third aspect, an implementation provides a system, including one or more processors coupled to a memory, that can execute a computer program that includes the method described in the first aspect on a computer processor.

Particular aspects of the technology disclosed are described in the claims, specification and drawings.

BRIEF DESCRIPTION OF THE DRAWINGS

The technology will be described with reference to the drawings, in which:

FIG. 10 shows an example buffer implemented in a series of memory units.

FIG. 11 illustrates data movement in an example cascaded buffer.

FIG. 12 shows an example buffer implemented in multiple parallel memory units.

FIG. 13 shows an example buffer implemented in a hybrid topology of memory units FIG. 14 shows an example buffer implemented in another hybrid topology of memory units.

FIG. 15 shows pseudocode for an example method of determining a buffer implementation topology.

Figure 1:
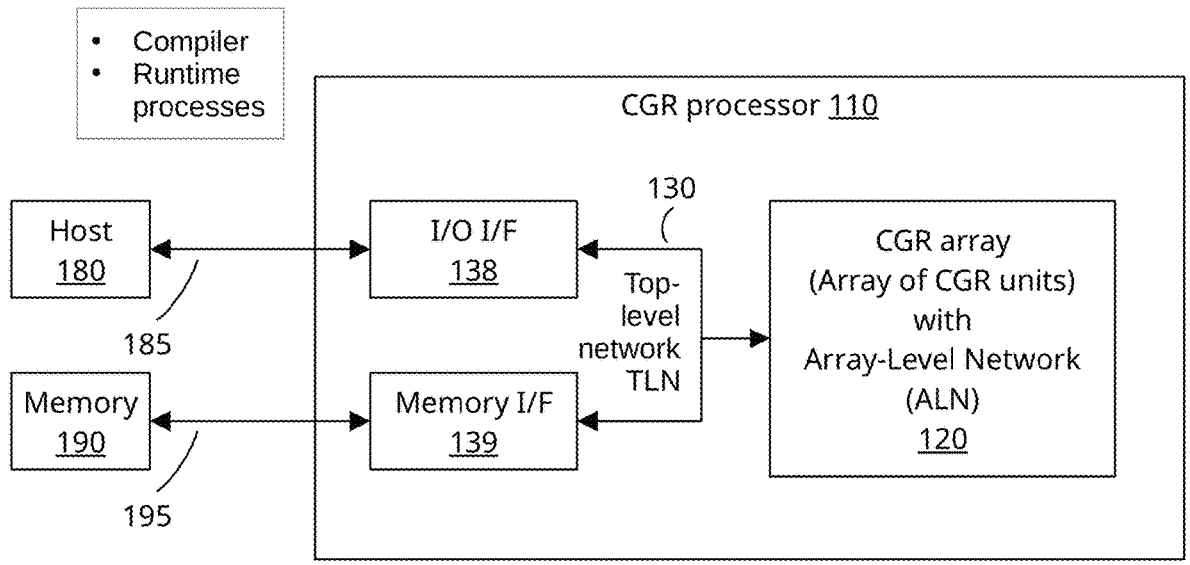
FIG. 1 illustrates an example system including a coarse-grained reconfigurable (CGR) processor, a host, and a memory.

In the figures, like reference numbers may indicate functionally similar elements. The systems and methods illustrated in the figures, and described in the Detailed Description below, may be arranged and designed in a wide variety of different implementations. Neither the figures nor the Detailed Description are intended to limit the scope of the claims. Instead, they merely represent examples of different implementations of the disclosed technology.

DETAILED DESCRIPTION

Traditional compilers translate human-readable computer source code into machine code that can be executed on a Von Neumann computer architecture. In this architecture, a processor serially executes instructions in one or more threads of software code. The architecture is static and the compiler does not determine how execution of the instruction is pipelined, or which processor or memory takes care of which thread. Thread execution is asynchronous, and safe exchange of data between parallel threads is not supported.

High-level programs for machine learning (ML) and artificial intelligence (AI) require massively parallel computations, where many parallel and interdependent threads exchange data. Such programs are ill-suited for execution on Von Neumann computers. They require architectures that are optimized for parallel processing, such as coarse-grained reconfigurable architectures (CGRAs) or graphic processing units (GPUs). The ascent of ML, AI, and massively parallel architectures places new requirements on compilers, including how computation graphs, and in particular dataflow graphs, are pipelined, which operations are assigned to which compute units, how data is routed between various compute units and memory units, and how synchronization is controlled particularly when a dataflow graph includes one or more nested loops, whose execution time varies dependent on the data being processed.

The high-level programs may be developed on a popular machine-learning framework such as PyTorch or TensorFlow. To execute a high-level program, a compiler must first translate it to one or more processor-executable files that can be loaded into one or more processors that operate in tandem. The translation can take several intermediate steps, including translation to, or extraction of, one or more dataflow graphs, and refinements, additions, and optimizations to make the dataflow graphs suitable for the hardware on which they are to be executed, as well as assignment of the various graph elements to physical units and routing channels available in the processor(s). The assignment function is known as place and route (PNR).

The dataflow graphs may include multiple meta-pipelines (see definition below) of parallel, interdependent operations. The meta-pipelines may include loops, and even nested loops, and operations may not have a fixed duration, so that the meta-pipelines run asynchronously. Thus, a dataflow compiler must resolve the asynchronous operation of the interdependent meta-pipelines, as well as synchronization within the meta-pipelines, and it must resolve PNR using the available hardware efficiently, without causing excessive dissipation, or loss of performance due to congestion of the routing channels used. Those functions are unknown in traditional compilers for von Neumann architecture computers.

One compiler task is to partition the dataflow graphs into pipeline stages of the meta-pipelines, and to insert stage buffers to separate the pipeline stages. In some cases, some data from a stage may be used not by a stage that immediately follows, but by a stage further downstream. Thus, the data must skip the operations of one or more stages, to which end it is stored in a so-called skip buffer.

Buffers are implemented in memory units that are available in a CGR processor or a GPU. The buffer's requirements may make it suitable for implementation in a single memory unit, but if the buffer is too big for a single memory unit or has a high fan-in or fan-out, the buffer may need to be split over multiple memory units. This document discloses buffer architectures and methods for determining such splits.

Terminology

As used herein, the phrase one of should be interpreted to mean exactly one of the listed items. For example, the phrase "one of A, B, and C" should be interpreted to mean any of: only A, only B, or only C.

As used herein, the phrases at least one of and one or more of should be interpreted to mean one or more items. For example, the phrase "at least one of A, B, and C" or the phrase "at least one of A, B, or C" should be interpreted to mean any combination of A, B, and/or C. The phrase "at least one of A, B, and C" means at least one of A and at least one of B and at least one of C.

Unless otherwise specified, the use of ordinal adjectives first, second, third, etc., to describe an object, merely refers to different instances or classes of the object and does not imply any ranking or sequence.

The following terms or acronyms used herein are defined at least in part as follows:

AGCU— address generator (AG) and coalescing unit (CU).

AI— artificial intelligence.

AIR— arithmetic or algebraic intermediate representation.

ALN— array-level network.

Buffer—an intermediate storage of data.

CGR—coarse-grained reconfigurable. A property of, for example, a system, a processor, an architecture (see CGRA), an array, or a unit in an array. This property distinguishes the system, etc., from field-programmable gate arrays (FPGAs), which can implement digital circuits at the gate level and are therefore fine-grained configurable.

CGRA—coarse-grained reconfigurable architecture. A data processor architecture that includes one or more arrays (CGR arrays) of CGR units.

Compiler—a translator that processes statements written in a programming language to machine language instructions for a computer processor. A compiler may include multiple stages to operate in multiple steps. Each stage may create or update an intermediate representation (IR) of the translated statements. Compiler stages are illustrated with reference to FIG. 5.

Computation graph—some algorithms can be represented as computation graphs. As used herein, computation graphs are a type of directed graphs comprising nodes that represent mathematical operations/expressions and edges that indicate dependencies between the operations/expressions. For example, with machine learning (ML) algorithms, input layer nodes assign variables, output layer nodes represent algorithm outcomes, and hidden layer nodes perform operations on the variables. Edges represent data (e.g., scalars, vectors, tensors) flowing between operations. In addition to dependencies, the computation graph reveals which operations and/or expressions can be executed concurrently.

CGR unit—a circuit that can be configured and reconfigured to locally store data (e.g., a memory unit or a PMU), or to execute a programmable function (e.g., a compute unit or a PCU). A CGR unit includes hardwired functionality that performs a limited number of functions used in computation graphs and dataflow graphs. Further examples of CGR units include a CU and an AG, which may be combined in an AGCU. Some implementations include CGR switches, whereas other implementations may include regular switches.

CU—coalescing unit.

Data Flow Graph—a computation graph that includes one or more loops that may be nested, and wherein nodes can send messages to nodes in earlier layers to control the dataflow between the layers.

Datapath—a collection of functional units that perform data processing operations. The functional units may include memory, multiplexers, ALUs, SIMDs, multipliers, registers, buses, etc.

FCMU—fused compute and memory unit—a circuit that includes both a memory unit and a compute unit.

Graph—a collection of nodes connected by edges. Nodes may represent various kinds of items or operations, dependent on the type of graph. Edges may represent relationships, directions, dependencies, etc.

IC—integrated circuit—a monolithically integrated circuit, i.e., a single semiconductor die which may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.

A logical CGR array or logical CGR unit—a CGR array or a CGR unit that is physically realizable, but that may not have been assigned to a physical CGR array or to a physical CGR unit on an IC.

ML—machine learning.

PCU—pattern compute unit—a compute unit that can be configured to perform one or more operations.

PEF—processor-executable format—a file format suitable for configuring a configurable data processor.

Pipeline—a staggered flow of operations through a chain of pipeline stages. The operations may be executed in parallel and in a time-sliced fashion. Pipelining increases overall instruction throughput. CGR processors may include pipelines at different levels. For example, a compute unit may include a pipeline at the gate level to enable correct timing of gate-level operations in a synchronous logic implementation of the compute unit, and a meta-pipeline at the graph execution level to enable correct timing of node-level operations of the configured graph. Gate-level pipelines are usually hard wired and unchangeable, whereas meta-pipelines are configured at the CGR processor, CGR array level, and/or GCR unit level.

Pipeline Stages—a pipeline is divided into stages that are coupled with one another to form a pipe topology.

PMU—pattern memory unit—a memory unit that can locally store data.

PNR—place and route—the assignment of logical CGR units and associated processing/operations to physical CGR units in an array, and the configuration of communication paths between the physical CGR units.

RAIL—reconfigurable dataflow unit (RDU) abstract intermediate language.

CGR Array—an array of CGR units, coupled with each other through an array-level network (ALN), and coupled with external elements via a top-level network (TLN). A CGR array can physically implement the nodes and edges of a dataflow graph and is sometimes referred to as a reconfigurable dataflow unit (RDU).

SIMD—single-instruction multiple-data—an arithmetic logic unit (ALU) that simultaneously performs a single programmable operation on multiple data elements delivering multiple output results.

Skip buffer—a buffer that stores data that is passed from a producer in a first meta-pipeline stage to a consumer in a second meta-pipeline stage. The buffer has a depth of three or more timesteps.

Stage buffer—a buffer that can be written and read at the same time. The buffer has a depth of two or more timesteps.

TLIR—template library intermediate representation.

TLN—top-level network.

Implementations

The architecture, configurability and dataflow capabilities of an array of CGR units enable increased compute power that supports both parallel and pipelined computation. A CGR processor, which includes one or more CGR arrays (arrays of CGR units), can be programmed to simultaneously execute multiple independent and interdependent dataflow graphs. To enable simultaneous execution, the dataflow graphs may need to be distilled from a high-level program and translated to a configuration file for the CGR processor. A high-level program is source code written in programming languages like Spatial, Python, C++, and C, and may use computation libraries for scientific computing, ML, AI, and the like. The high-level program and referenced libraries can implement computing structures and algorithms of machine learning models like AlexNet, VGG Net, GoogleNet, ResNet, ResNeXt, RCNN, YOLO, SqueezeNet, SegNet, GAN, BERT, ELMo, USE, Transformer, and Transformer-XL.

Translation of high-level programs to executable bit files is performed by a compiler. While traditional compilers sequentially map operations to processor instructions, typically without regard to pipeline utilization and duration (a task usually handled by the hardware), an array of CGR units requires mapping operations to processor instructions in both space (for parallelism) and time (for synchronization of interdependent computation graphs or dataflow graphs). This requirement implies that a compiler for a CGRA must decide which operation of a computation graph or dataflow graph is assigned to which of the CGR units, and how both data and, related to the support of dataflow graphs, control information flows among CGR units, and to and from external hosts and storage. This process, known as "place and route", is one of many new challenges posed to compilers for arrays of CGR units.

FIG. 1 illustrates an example system 100 including a CGR processor 110, a host 180, and a memory 190. CGR processor 110 has a coarse-grained reconfigurable architecture (CGRA) and includes an array of CGR units 120 such as a CGR array. CGR processor 110 further includes an IO interface 138, and a memory interface 139. Array of CGR units 120 is coupled with IO interface 138 and memory interface 139 via databus 130 which may be part of a top-level network (TLN). Host 180 communicates with IO interface 138 via system databus 185, and memory interface 139 communicates with memory 190 via memory bus 195. Array of CGR units 120 may further include compute units and memory units that connected with an array-level network (ALN) to provide the circuitry for execution of a computation graph or a dataflow graph that may have been derived from a high-level program with user algorithms and functions. The high-level program may include a set of procedures, such as learning or inferencing in an AI or ML system. More specifically, the high-level program may include applications, graphs, application graphs, user applications, computation graphs, control flow graphs, dataflow graphs, models, deep learning applications, deep learning neural networks, programs, program images, jobs, tasks and/or any other procedures and functions that may need serial and/or parallel processing. In some implementations, execution of the graph(s) may involve using multiple units of CGR processor 110. In some implementations, CGR processor 110 may include one or more ICs. In other implementations, a single IC may span multiple coarsely reconfigurable data processors. In further implementations, CGR processor 110 may include one or more units of array of CGR units 120.

Host 180 may be, or include, a computer such as further described with reference to FIG. 2. Host 180 runs runtime processes, as further referenced herein, and may also be used to run computer programs, such as the compiler further described herein with reference to FIG. 12. In some implementations, the compiler may run on a computer that is similar to the computer described with reference to FIG. 2, but separate from host 180.

CGR processor 110 may accomplish computational tasks by executing a configuration file (for example, a PEF file). For the purposes of this description, a configuration file corresponds to a dataflow graph, or a translation of a dataflow graph, and may further include initialization data. A compiler compiles the high-level program to provide the configuration file. In some implementations described herein, a CGR array is configured by programming one or more configuration stores with all or parts of the configuration file. A single configuration store may be at the level of the CGR processor or the CGR array, or a CGR unit may include an individual configuration store. The configuration file may include configuration data for the CGR array and CGR units in the CGR array, and link the computation graph to the CGR array. Execution of the configuration file by CGR processor 110 causes the CGR array (s) to implement the user algorithms and functions in the dataflow graph.

CGR processor 110 can be implemented on a single integrated circuit die or on a multichip module (MCM). An IC can be packaged in a single chip module or a multichip module. An MCM is an electronic package that may comprise multiple IC dies and other devices, assembled into a single module as if it were a single device. The various dies of an MCM may be mounted on a substrate, and the bare dies of the substrate are electrically coupled to the surface or to each other using for some examples, wire bonding, tape bonding or flip-chip bonding.

Figure 2:
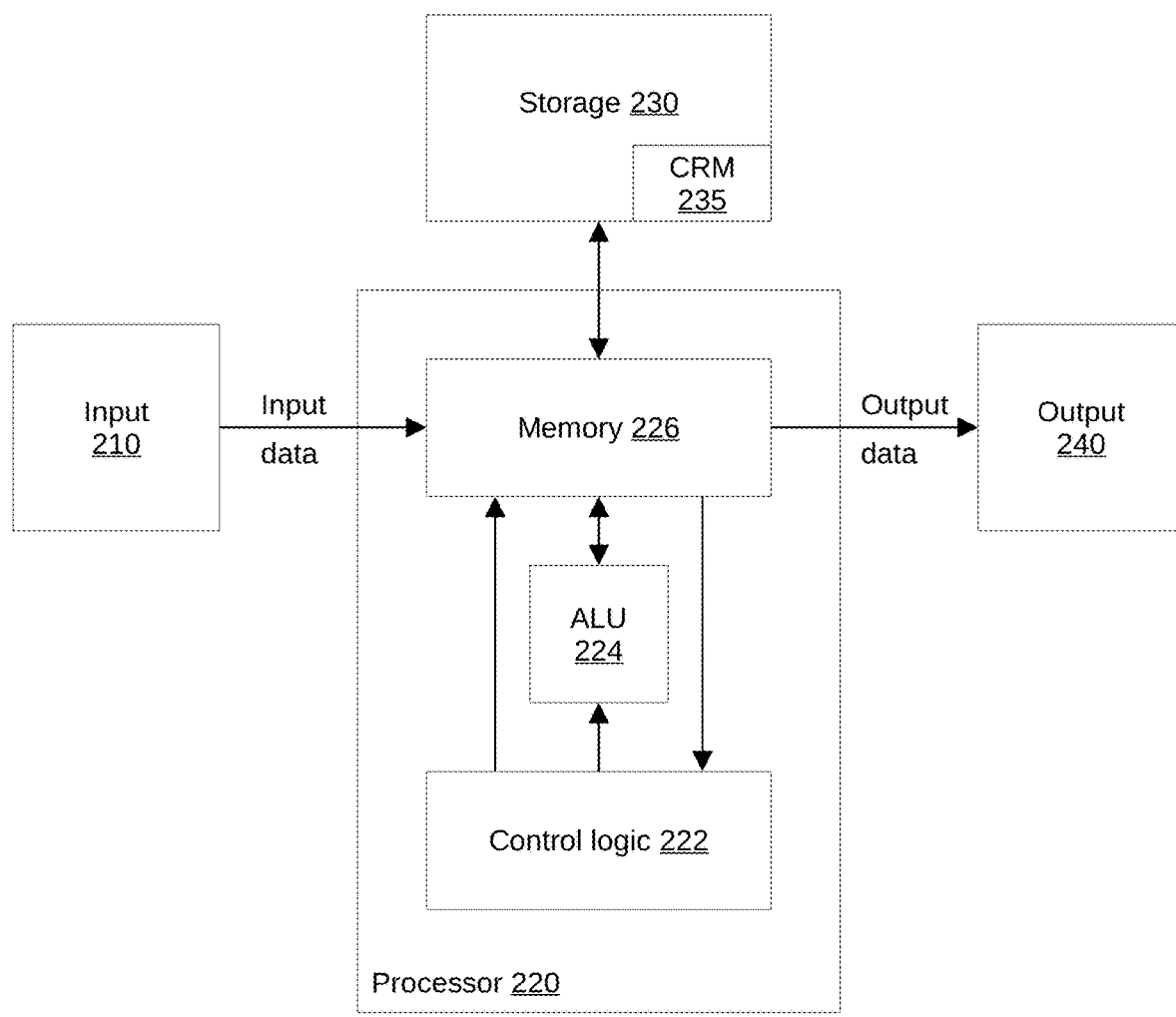
FIG. 2 illustrates an example of a computer, including an input device, a processor, a storage device, and an output device.

FIG. 2 illustrates an example of a computer 200, including an input device 210, a processor 220, a storage device 230, and an output device 240. Although the example computer 200 is drawn with a single processor, other implementations may have multiple processors. Input device 210 may comprise a mouse, a keyboard, a sensor, an input port (for example, a universal serial bus (USB) port), and any other input device known in the art. Output device 240 may comprise a monitor, printer, and any other output device known in the art. Furthermore, part or all of input device 210 and output device 240 may be combined in a network interface, such as a Peripheral Component Interconnect Express (PCIe) interface suitable for communicating with CGR processor 110. Input device 210 is coupled with processor 220 to provide input data, which an implementation may store in memory 226. Processor 220 is coupled with output device 240 to provide output data from memory 226 to output device 240. Processor 220 further includes control logic 222, operable to control memory 226 and arithmetic and logic unit (ALU) 224, and to receive program and configuration data from memory 226. Control logic 222 further controls exchange of data between memory 226 and storage device 230. Memory 226 typically comprises memory with fast access, such as static random-access memory (SRAM), whereas storage device 230 typically comprises memory with slow access, such as dynamic random-access memory (DRAM), flash memory, magnetic disks, optical disks, and any other memory type known in the art. At least a part of the memory in storage device 230 includes a non-transitory computer-readable medium (CRM 235), such as used for storing computer programs.

Figure 3:
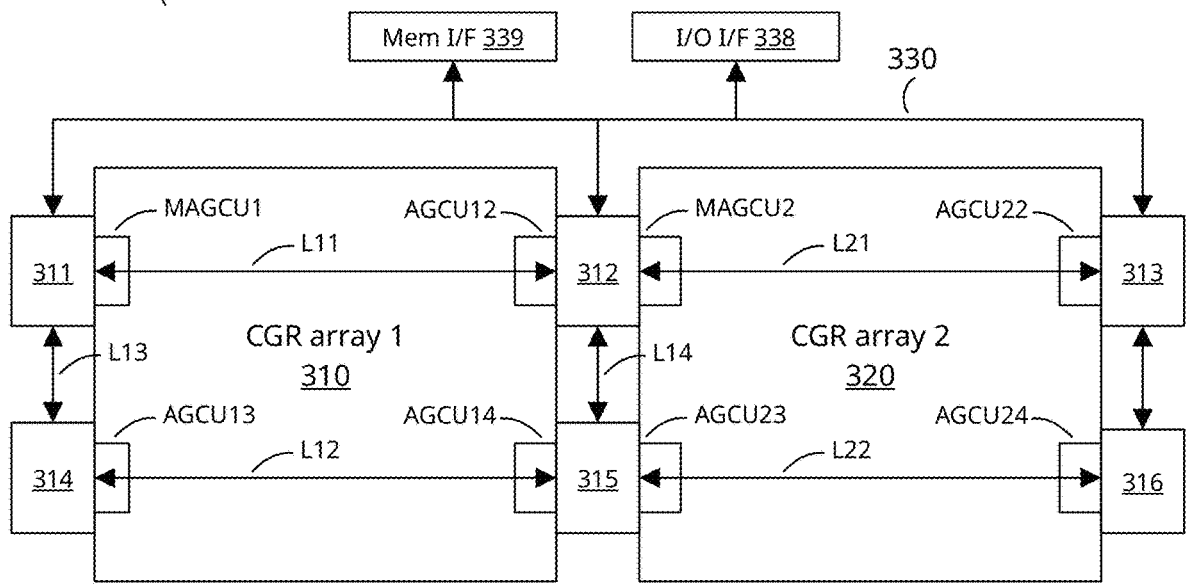
FIG. 3 illustrates example details of a CGR architecture including a top-level network (TLN) and two CGR arrays.

FIG. 3 illustrates example details of a CGR architecture 300 including a top-level network (TLN 330) and two CGR arrays (CGR array 310 and CGR array 320). A CGR array comprises an array of CGR units (e.g., PMUs, PCUs, FCMUs) coupled via an array-level network (ALN), e.g., a bus system. The ALN is coupled with the TLN 330 through several AGCUs, and consequently with I/O interface 338 (or any number of interfaces) and memory interface 339. Other implementations may use different bus or communication architectures.

Circuits on the TLN in this example include one or more external I/O interfaces, including I/O interface 338 and memory interface 339. The interfaces to external devices include circuits for routing data among circuits coupled with the TLN and external devices, such as high-capacity memory, host processors, other CGR processors, FPGA devices, and so on, that are coupled with the interfaces.

Each depicted CGR array has four AGCUs (e.g., MAGCU1, AGCU12, AGCU13, and AGCU14 in CGR array 310). The AGCUs interface the TLN to the ALNs and route data from the TLN to the ALN or vice versa.

One of the AGCUs in each CGR array in this example is configured to be a master AGCU (MAGCU), which includes an array configuration load/unload controller for the CGR array. The MAGCU1 includes a configuration load/unload controller for CGR array 310, and MAGCU2 includes a configuration load/unload controller for CGR array 320. Some implementations may include more than one array configuration load/unload controller. In other implementations, an array configuration load/unload controller may be implemented by logic distributed among more than one AGCU. In yet other implementations, a configuration load/unload controller can be designed for loading and unloading configuration of more than one CGR array. In further implementations, more than one configuration controller can be designed for configuration of a single CGR array. Also, the configuration load/unload controller can be implemented in other portions of the system, including as a stand-alone circuit on the TLN and the ALN or ALNs.

The TLN is constructed using top-level switches (switch 311, switch 312, switch 313, switch 314, switch 315, and switch 316) coupled with each other as well as with other circuits on the TLN, including the AGCUs, and external I/O interface 338. The TLN includes links (e.g., L11, L12, L21, L22) coupling the top-level switches. Data may travel in packets between the top-level switches on the links, and from the switches to the circuits on the network coupled with the switches. For example, switch 311 and switch 312 are coupled by link L11, switch 314 and switch 315 are coupled by link L12, switch 311 and switch 314 are coupled by link L13, and switch 312 and switch 313 are coupled by link L21. The links can include one or more buses and supporting control lines, including for example a chunk-wide bus (vector bus). For example, the top-level network can include data, request and response channels operable in coordination for transfer of data in any manner known in the art.

Figure 4:
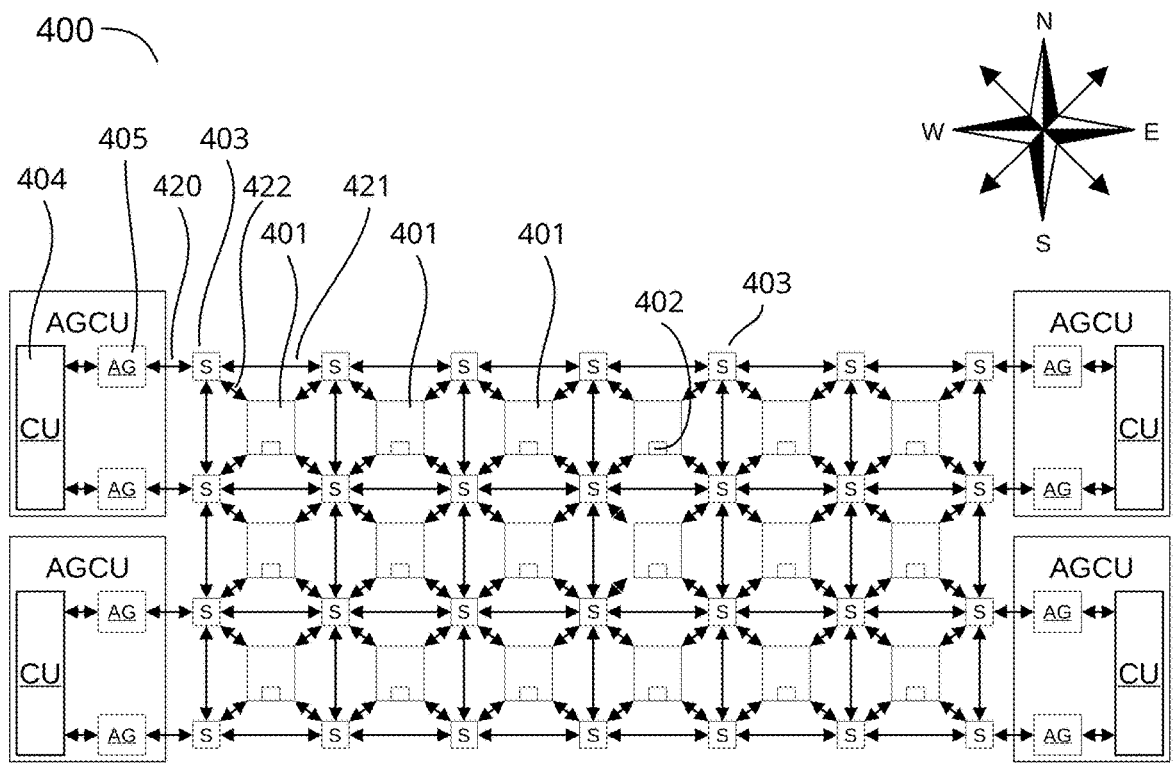
FIG. 4 illustrates an example CGR array, including an array of configurable nodes in an array-level network (ALN).

FIG. 4 illustrates an example CGR array 400, including an array of CGR units in an ALN. CGR array 400 may include several types of CGR unit 401, such as FCMUs, PMUs, PCUs, memory units, and/or compute units. For examples of the functions of these types of CGR units, see Prabhakar et al., "Plasticine: A Reconfigurable Architecture for Parallel Patterns", ISCA 2017, Jun. 24-28, 2017, Toronto, ON, Canada. Each of the CGR units may include a configuration store 402 comprising a set of registers or flip-flops storing configuration data that represents the setup and/or the sequence to run a program, and that can include the number of nested loops, the limits of each loop iterator, the instructions to be executed for each stage, the source of operands, and the network parameters for the input and output interfaces. In some implementations, each CGR unit 401 comprises an FCMU. In other implementations, the array comprises both PMUs and PCUs, or memory units and compute units, arranged in a checkerboard pattern. In yet other implementations, CGR units may be arranged in different patterns. The ALN includes switch units 403 (S), and AGCUs (each including two address generators 405 (AG) and a shared coalescing unit 404 (CU)). Switch units 403 are connected among themselves via interconnects 421 and to a CGR unit 401 with interconnects 422. Switch units 403 may be coupled with address generators 405 via interconnects 420. In some implementations, communication channels can be configured as end-to-end connections, and switch units 403 are CGR units. In other implementations, switches route data via the available links based on address information in packet headers, and communication channels establish as and when needed.

A configuration file may include configuration data representing an initial configuration, or starting state, of each of the CGR units that execute a high-level program with user algorithms and functions. Program load is the process of setting up the configuration stores in the CGR array based on the configuration data to allow the CGR units to execute the high-level program. Program load may also require loading memory units and/or PMUs.

The ALN includes one or more kinds of physical data buses, for example a chunk-level vector bus (e.g., 512 bits of data), a word-level scalar bus (e.g., 32 bits of data), and a control bus. For instance, interconnects 421 between two switches may include a vector bus interconnect with a bus width of 512 bits, and a scalar bus interconnect with a bus width of 32 bits. A control bus can comprise a configurable interconnect that carries multiple control bits on signal routes designated by configuration bits in the CGR array's configuration file. The control bus can comprise physical lines separate from the data buses in some implementations. In other implementations, the control bus can be implemented using the same physical lines with a separate protocol or in a time-sharing procedure.

Physical data buses may differ in the granularity of data being transferred. In one implementation, a vector bus can carry a chunk that includes 16 channels of 32-bit floating-point data or 32 channels of 16-bit floating-point data (i.e., 512 bits) of data as its payload. A scalar bus can have a 32-bit payload and carry scalar operands or control information. The control bus can carry control handshakes such as tokens and other signals. The vector and scalar buses can be packet-switched, including headers that indicate a destination of each packet and other information such as sequence numbers that can be used to reassemble a file when the packets are received out of order. Each packet header can contain a destination identifier that identifies the geographical coordinates of the destination switch unit (e.g., the row and column in the array), and an interface identifier that identifies the interface on the destination switch (e.g., North, South, East, West, etc.) used to reach the destination unit.

A CGR unit 401 may have four ports (as drawn) to interface with switch units 403, or any other number of ports suitable for an ALN. Each port may be suitable for receiving and transmitting data, or a port may be suitable for only receiving or only transmitting data.

A switch unit, as shown in the example of FIG. 4, may have eight interfaces. The North, South, East and West interfaces of a switch unit may be used for links between switch units using interconnects 421. The Northeast, Southeast, Northwest and Southwest interfaces of a switch unit may each be used to make a link with an FCMU, PCU or PMU instance using one of the interconnects 422. Two switch units in each CGR array quadrant have links to an AGCU using interconnects 420. The AGCU coalescing unit arbitrates between the AGs and processes memory requests. Each of the eight interfaces of a switch unit can include a vector interface, a scalar interface, and a control interface to communicate with the vector network, the scalar network, and the control network. In other implementations, a switch unit may have any number of interfaces.

During execution of a graph or subgraph in a CGR array after configuration, data can be sent via one or more switch units and one or more links between the switch units to the CGR units using the vector bus and vector interface(s) of the one or more switch units on the ALN. A CGR array may comprise at least a part of CGR array 400, and any number of other CGR arrays coupled with CGR array 400.

A data processing operation implemented by CGR array configuration may comprise multiple graphs or subgraphs specifying data processing operations that are distributed among and executed by corresponding CGR units (e.g., FCMUs, PMUs, PCUs, AGs, and CUs).

Figure 5:
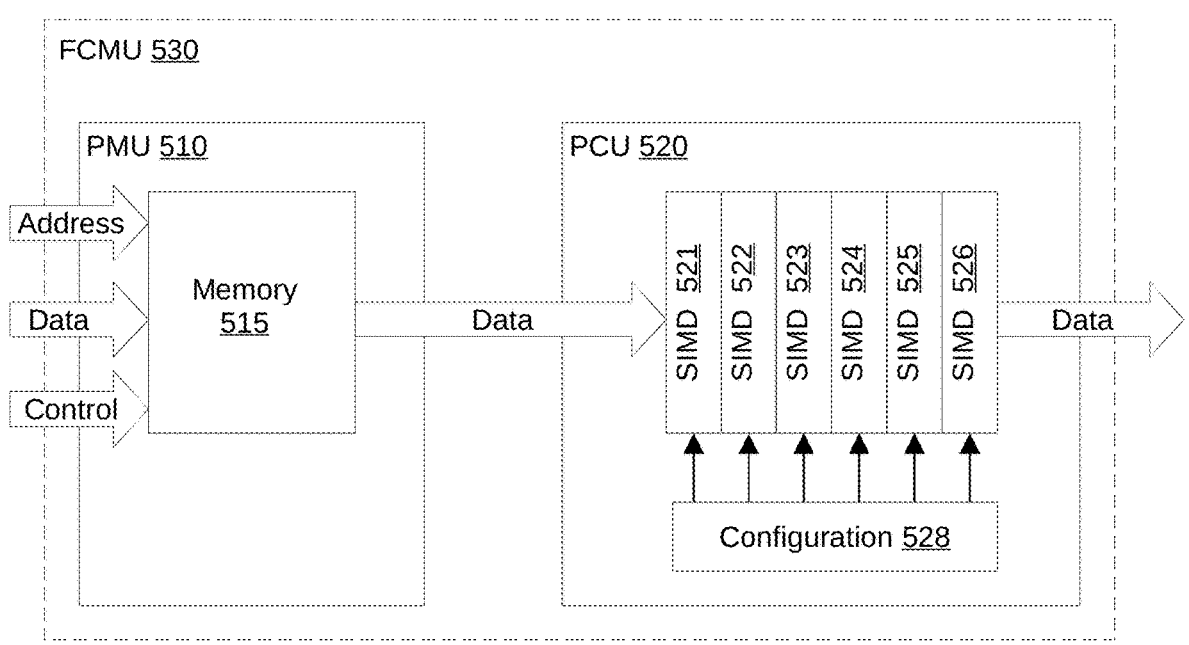
FIG. 5 illustrates an example of a pattern memory unit (PMU) and a pattern compute unit (PCU), which may be combined in a fused-control memory unit (FCMU).

FIG. 5 illustrates an example 500 of a PMU 510 and a PCU 520, which may be combined in an FCMU 530. PMU 510 may be directly coupled to PCU 520, or optionally via one or more switches. PMU 510 includes a scratchpad memory 515, which may receive external data, memory addresses, and memory control information (write enable, read enable) via one or more buses included in the ALN. PCU 520 includes two or more processor stages, such as SIMD 521 through SIMD 526, and configuration store 528. The processor stages may include ALUs, or SIMDs, as drawn, or any other reconfigurable stages that can process data.

Each stage in PCU 520 may also hold one or more registers (not drawn) for short-term storage of parameters.

Short-term storage, for example during one to several clock cycles or unit delays, allows for synchronization of data in the PCU pipeline.

Figure 6:
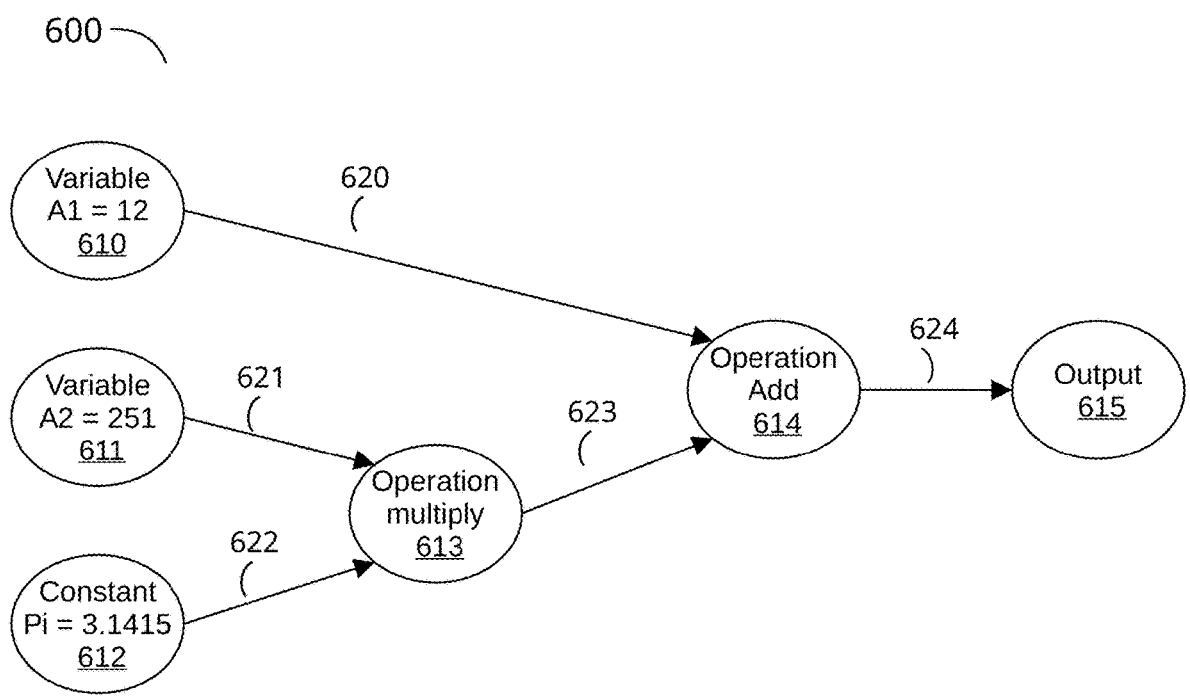
FIG. 6 shows an example of a computation graph.

FIG. 6 shows an example of a computation graph 600. Computation graphs represent mathematical expressions, and comprise nodes and directed edges. In FIG. 6, nodes are drawn as circles and directed edges are drawn as arrows. A node can represent a constant, a variable, for example from an input, an operation, an equation, or an output value. A directed edge can represent a dependency. Node 610 represents a variable A1, whose present value equals 12. Node 611 represents a variable A2, whose present value equals 251. Node 612 represents the constant π. Node 613 represents a multiplication operation. It receives its input data from node 611 via directed edge 621 and from node 612 via directed edge 622. Node 614 represents an addition operation. Node 614 receives its input data from node 610 via directed edge 620 and from node 613 via directed edge 623. Node 614 outputs its result in output node 615 via directed edge 624. Computation graph 600 as a whole represents the equation Output=A1+pi*A2.

The depicted computation graph 600 is very simple and could be implemented electronically in many ways. For example, it could be hardwired as a circuit of digital gates in an application-specific IC (ASIC), or an FPGA could be configured to emulate the circuit of digital gates, or a CGR processor could be configured to perform the addition and multiplication functions, or a CPU could run a conventional computer program to perform the functions. In all implementations, the timing is important. Node 614 is not able to calculate a valid output value until all its input values are valid. That means node 613 must be finished first. Most digital circuits are implemented as pipelines of clocked stages. If the add operation of node 614 is in a later stage than the multiplication operation of node 613, then a fixed-delay buffer may need to be inserted between node 610 and node 614 to synchronize the value of variable A1 with the result of the multiplication in node 613. The fixed-delay buffer can be added to the graph to make it physically implementable.

Most computation graphs are a-cyclic, i.e., they don't include loops. One class of computation graphs, dataflow graphs, may include loops, and even nested loops. This can make delays of operations performed by nodes variable, dependent on the data flowing through a pipeline of operations. When a high-level program includes multiple pipelines of parallel, interdependent operations, then synchronization can become highly complex. Synchronization can be further complicated when directed edges are implemented as data channels in a network, since the data channels can become congested. A CGR processor, may resolve both problems by using dataflow control information, sent as messages from consuming nodes to producing nodes to indicate that the consuming node is ready to receive the information, and a credit token system that prevents congestion of the data channels between the producing and consuming nodes.

Figure 7:
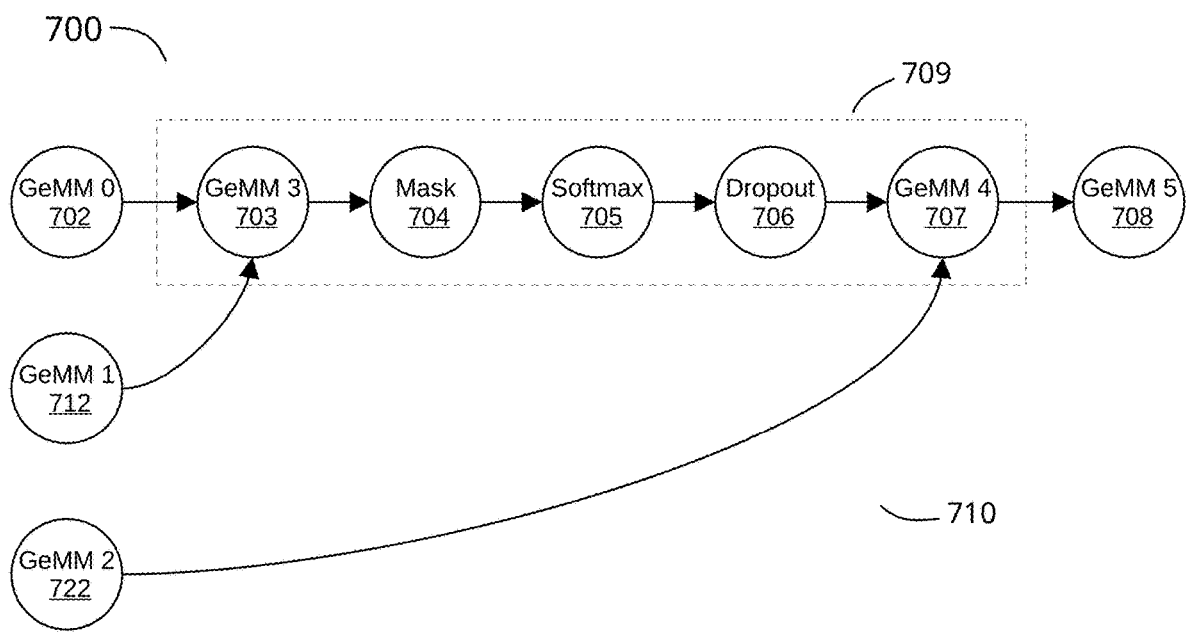
FIG. 7 shows an example of a dataflow graph.

FIG. 7 shows an example of a dataflow graph 700. This example, one head of a multi-head attention module in the Transformer model first published by Vaswani, et al., "Attention Is All You Need," 31st Conference on Neural Information Processing Systems, 2017, is well known in the industry. It includes a loop 709 within a loop 710. Loop 710 includes four general matrix multiplications, GeMM 702, GeMM 712, GeMM 722, and GeMM 708. Loop 709 includes an ingress matrix multiplication GeMM 703, mask fill node 704, softmax node 705, dropout node 706, and egress matrix multiplication node 707.

To physically implement dataflow graph 700, an implementation may insert three types of stage buffers: (1) inter-stage buffers, (2) intra-stage buffers, and (3) interface buffers. The interface buffers are used because the granularity of communication (i.e., the size of tensors or data produced or consumed) varies between loops at different levels. Further, an implementation must add dataflow control information, to synchronize the various stages of asynchronous computation.

Figure 8:
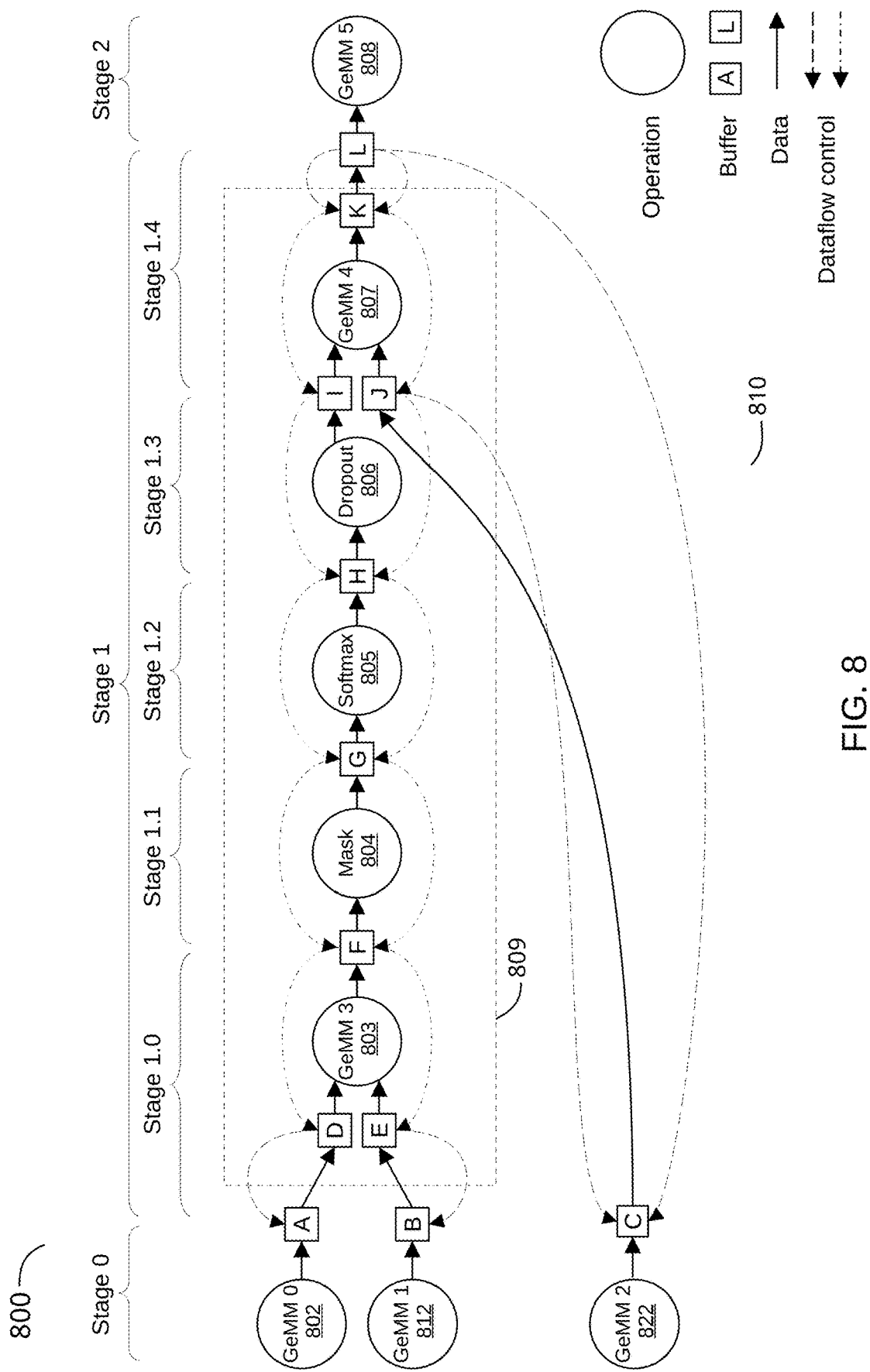
FIG. 8 shows the dataflow graph of FIG. 7 with buffers and dataflow control information added.

FIG. 8 shows the dataflow graph of FIG. 7 with buffers and dataflow control information added. A compiler in the technology presented herein can create graph 800 from dataflow graph 700, assign the nodes to compute units and memory units in a CGR array, and assign edges and dataflow control information to data channels in an array-level network that connects the compute units and memory units.

To get from dataflow graph 700 to graph 800, one compiler implementation divides the dataflow graph in stages (stages 0, 1, and 2 are shown in this example), and where there are nested loops also in substages (substages 1.0 through 1.4 are shown). The implementation inserts buffers between the stages to allow for pipelined processing in one or more parallel meta-pipelines that may interact. The buffers are shown as blocks labeled A . . . L. They are different from buffers at the gate level, which may be single or double inverters used to boost the energy level of digital signals that need to travel through long wires or that need to drive high-capacitance loads, or which may be flipflops operated by a system clock and used to implement synchronous logic. The buffers at the meta-pipeline level may be memories, register files, shift registers, or first-in-first-out (FIFO) memories of fixed or variable length, storing one or more data items (e.g., scalars, vectors, or tensors). They may be clocked by a producer node to store data or by a consumer node to release data. They may further be controlled by dataflow control information coming from, for example, downstream nodes. FIG. 8 shows the same operation nodes as FIG. 7 (with like numbering), but the edges (solid arrows), where data flows, are interrupted by the buffers to partition the graph into stages, and dataflow control information is added (shown as dashed arrows for loop 810 and dash-dot arrows for loop 809). In the example shown, data travels downstream (solid arrows from the left to the right) and dataflow control information travels upstream (dashed arrows from the right to the left).

In further preparation for a physical implementation of graph 800, an implementation may assign each operation node to one or more logical compute units or memory units, and each buffer to one or more logical memory units. Some implementations may perform further preparations and optimizations. All implementations proceed to place and route, i.e., assign the logical units to physical units in a layout of a coarsely reconfigurable array, and (in some implementations) assign the data connections and the dataflow control information connections to data channels in the ALN in the CGR array.

Figure 9:
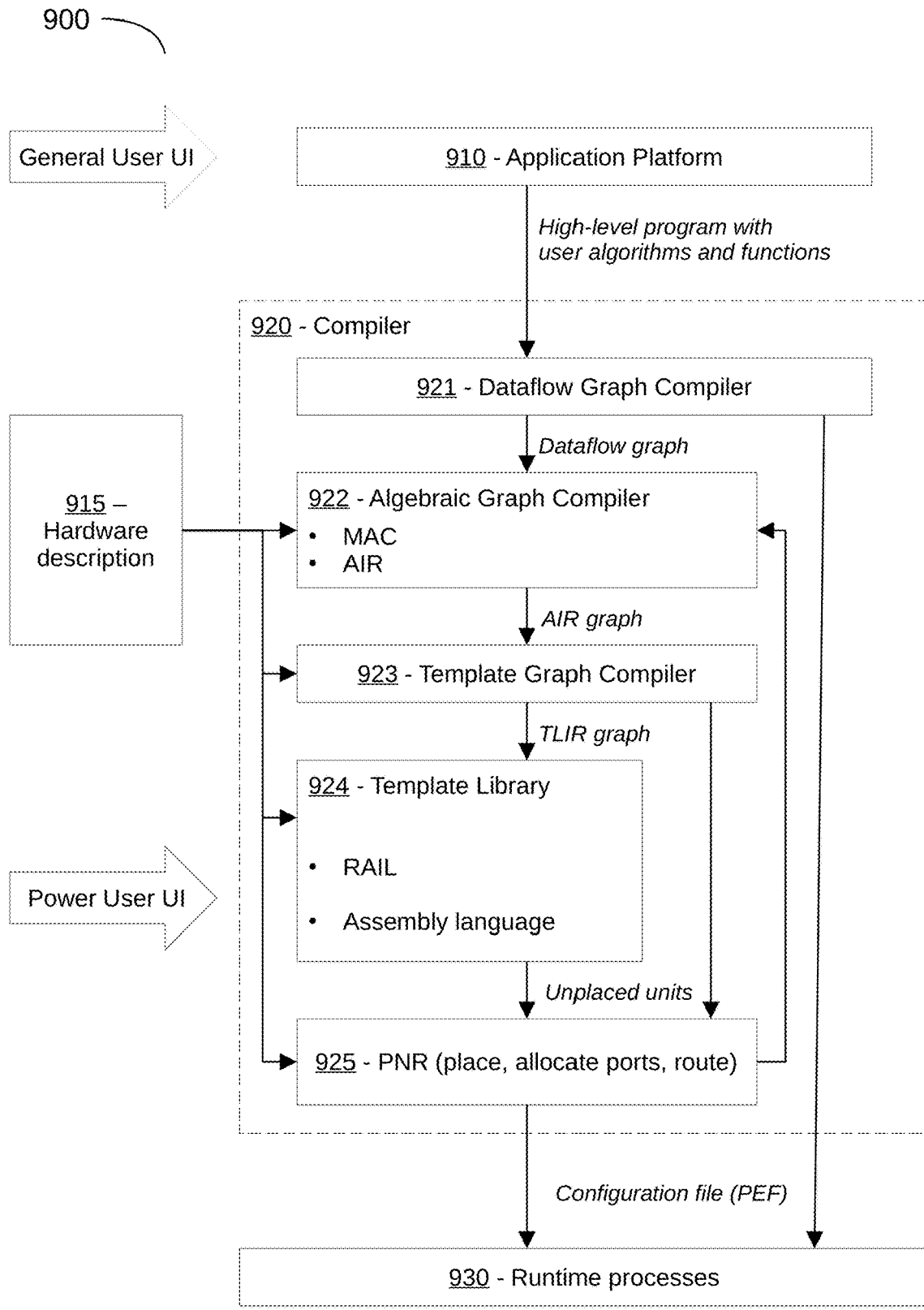
FIG. 9 is a block diagram of a compiler stack implementation suitable for generating a configuration file for a CGR processor.

FIG. 9 is a block diagram of a compiler stack 900 implementation suitable for generating a configuration file for a CGR processor. As depicted, compiler stack 900 includes several stages to convert a high-level program with user algorithms and functions, e.g., algebraic expressions and functions, to configuration data for the CGR units. Compiler stack 900 may take its input from application platform 910, or any other source of high-level program statements suitable for parallel processing, which provides a user interface for general users. It may further receive hardware description 915, for example defining the physical units in a reconfigurable data processor or CGRA processor. Application platform 910 may include libraries such as PyTorch, TensorFlow, ONNX, Caffe, and Keras to provide user-selected and configured algorithms. Application platform 910 outputs a high-level program to compiler 920, which in turn outputs a configuration file to the reconfigurable data processor or CGRA processor where it is executed in runtime processes 930. Compiler 920 may include dataflow graph compiler 921, which may handle a dataflow graph, algebraic graph compiler 922, template graph compiler 923, template library 924, and placer and router PNR 925. In some implementations, template library 924 includes RDU abstract intermediate language (RAIL) and/or assembly language interfaces for power users.

Dataflow graph compiler 921 converts the high-level program with user algorithms and functions from application platform 910 to one or more dataflow graphs. The high-level program may be suitable for parallel processing, and therefore parts of the nodes of the dataflow graphs may be intrinsically parallel unless an edge in the graph indicates a dependency. Dataflow graph compiler 921 may provide code optimization steps like false data dependency elimination, dead-code elimination, and constant folding. The dataflow graphs encode the data and control dependencies of the high-level program. Dataflow graph compiler 921 may support programming a reconfigurable data processor at higher or lower-level programming languages, for example from an application platform 910 to C++ and assembly language. In some implementations, dataflow graph compiler 921 allows programmers to provide code that runs directly on the reconfigurable data processor. In other implementations, dataflow graph compiler 921 provides one or more libraries that include predefined functions like linear algebra operations, element-wise tensor operations, non-linearities, and reductions required for creating, executing, and profiling the dataflow graphs on the reconfigurable processors. Dataflow graph compiler 921 may provide an application programming interface (API) to enhance functionality available via the application platform 910.

Algebraic graph compiler 922 may include a model analyzer and compiler (MAC) level that makes high-level mapping decisions for (sub-graphs of the) dataflow graph based on hardware constraints. It may support various application frontends such as Samba, JAX, and TensorFlow/HLO. Algebraic graph compiler 922 may also transform the graphs via autodiff and GradNorm, perform stitching between sub-graphs, interface with template generators for performance and latency estimation, convert dataflow graph operations to AIR operation, perform tiling, sharding (database partitioning) and other operations, and model or estimate the parallelism that can be achieved on the dataflow graphs.

Algebraic graph compiler 922 may further include an arithmetic or algebraic intermediate representation (AIR) level that translates high-level graph and mapping decisions provided by the MAC level into explicit AIR graphs. Key responsibilities of the AIR level include legalizing the graph and mapping decisions of the MAC, expanding data parallel, tiling, metapipe, region, and instructions provided by the MAC, inserting stage buffers and skip buffers, eliminating redundant operations, and optimizing for resource use, latency, and throughput.

Template graph compiler 923 may translate AIR graphs into TLIR graphs, optimizing for the target hardware architecture and/or into unplaced units suitable for PNR 925. Template graph compiler 923 may add further information (name, inputs, input names and dataflow description) for PNR 925 and make the graph physically realizable through each performed step. Template graph compiler 923 may for example provide translation of AIR graphs to specific model operation templates such as for general matrix multiplication (GeMM). An implementation may convert part or all intermediate representation operations to templates, stitch templates into the dataflow and control flow, insert necessary buffers and layout transforms, generate test data and optimize for hardware use, latency, and throughput.

Implementations may use templates for common operations. Templates may be implemented using assembly language, RAIL, or similar. RAIL is comparable to assembly language in that memory units and compute units are separately programmed, but it can provide a higher level of abstraction and compiler intelligence via a concise performance-oriented domain-specific language for CGR array templates. RAIL enables template writers and external power users to control interactions between logical compute units and memory units with high-level expressions without the need to manually program capacity splitting, register allocation, etc. The logical compute units and memory units also enable stage/register allocation, context splitting, transpose slotting, resource virtualization and mapping to multiple physical compute units and memory units (e.g., PCUs and PMUs).

Template library 924 may include an assembler that provides an architecture-independent low-level programming interface as well as optimization and code generation for the target hardware. Responsibilities of the assembler may include address expression compilation, intra-unit resource allocation and management, making a template graph physically realizable with target-specific rules, low-level architecture-specific transformations and optimizations, and architecture-specific code generation.

PNR 925 translates and maps logical (i.e., unplaced physically realizable) CGR units to the physical chip level (e.g., a physical array of CGR units), determines physical data channels to allow for communication among the CGR units and between the CGR units and circuits coupled via the TLN, allocates ports on the CGR units and switches, provides configuration data and initialization data for the target hardware, and produces configuration files, e.g., processor-executable format (PEF) files. It may further provide bandwidth calculations, allocate network interfaces such as AGCUs and virtual address generators (VAGs), provide configuration data that allows AGCUs and/or VAGs to perform address translation, and control ALN switches and data routing. PNR 925 may provide its functionality in multiple steps and may include multiple modules (not shown in FIG. 9) to provide the multiple steps, e.g., a placer, a router, a port allocator, and a PEF file generator. PNR 925 may receive its input data in various ways. For example, it may receive parts of its input data from any of the earlier modules (dataflow graph compiler 921, algebraic graph compiler 922, template graph compiler 923, and/or template library 924). In some implementations, an earlier module, such as template graph compiler 923, may have the task of preparing all information for PNR 925 and no other units provide PNR input data directly.

Further implementations of compiler 920 provide for an iterative process, for example by feeding information from PNR 925 back to an earlier module, so that the earlier module can execute a new compilation step in which it uses physically realized results rather than estimates of or placeholders for physically realizable circuits. For example, PNR 925 may feed information regarding the physically realized circuits back to algebraic graph compiler 922.

Memory allocations represent the creation of logical memory spaces in on-chip and/or off-chip memories for data required to implement the dataflow graph, and these memory allocations are specified in the configuration file. Memory allocations define the type and the number of hardware circuits (functional units, storage, or connectivity components). Main memory (e.g., DRAM) may be off-chip memory, and scratchpad memory (e.g., SRAM) is on-chip memory inside an RDU. Other memory types for which the memory allocations can be made for various access patterns and layouts include cache, read-only look-up tables (LUTs), serial memories (e.g., FIFOs), and register files.

Compiler 920 binds memory allocations to unplaced memory units and binds operations specified by operation nodes in the dataflow graph to unplaced compute units, and these bindings may be specified in the configuration data. In some implementations, compiler 920 partitions parts of a dataflow graph into memory subgraphs and compute subgraphs, and specifies these subgraphs in the PEF file. A memory subgraph may comprise address calculations leading up to a memory access. A compute subgraph may comprise all other operations in the parent graph. In one implementation, a parent graph is broken up into multiple memory subgraphs and exactly one compute subgraph. A single parent graph can produce one or more memory subgraphs, depending on how many memory accesses exist in the original loop body. In cases where the same memory addressing logic is shared across multiple memory accesses, address calculation may be duplicated to create multiple memory subgraphs from the same parent graph.

Compiler 920 generates the configuration files with configuration data (e.g., a bit stream) for the placed positions and the routed data and control networks. In one implementation, this includes assigning coordinates and communication resources of the physical CGR units by placing and routing unplaced units onto the array of CGR units while maximizing bandwidth and minimizing latency.

A first example of accelerated deep learning is using a deep learning accelerator implemented in a CGRA to train a neural network. A second example of accelerated deep learning is using the deep learning accelerator to operate a trained neural network to perform inferences. A third example of accelerated deep learning is using the deep learning accelerator to train a neural network and subsequently perform inference with any one or more of the trained neural network, information from the trained neural network, and a variant of the same.

Examples of neural networks include fully connected neural networks (FCNNs), recurrent neural networks (RNNs), graph neural networks (GNNs), convolutional neural networks (CNNs), graph convolutional networks (GCNs), long short-term memory (LSTM) networks, auto-encoders, deep belief networks, and generative adversarial networks (GANs).

An example of training a neural network is determining one or more weights associated with the neural network, such as by back-propagation in a deep learning accelerator. An example of making an inference is using a trained neural network to compute results by processing input data using the weights associated with the trained neural network. As used herein, the term 'weight' is an example of a 'parameter' as used in various forms of neural network processing. For example, some neural network learning is directed to determining parameters (e.g., through back-propagation) that are usable for performing neural network inferences.

A neural network processes data according to a dataflow graph comprising layers of neurons. Example layers of neurons include input layers, hidden layers, and output layers. Stimuli (e.g., input data) are received by an input layer of neurons and the computed results of the dataflow graph (e.g., output data) are provided by an output layer of neurons. Example hidden layers include rectified linear unit (ReLU) layers, fully connected layers, recurrent layers, graphical network layers, long short-term memory layers, convolutional layers, kernel layers, dropout layers, and pooling layers. A neural network may be conditionally and/or selectively trained. After being trained, a neural network may be conditionally and/or selectively used for inference.

Examples of ICs, or parts of ICs, that may be used as deep learning accelerators, are processors such as central processing unit (CPUs), CGR processor ICs, graphics processing units (GPUs), FPGAs, ASICs, application-specific instruction-set processor (ASIP), and digital signal processors (DSPs). The disclosed technology implements efficient distributed computing by allowing an array of accelerators (e.g., reconfigurable processors) attached to separate hosts to directly communicate with each other via buffers.

A dataflow graph, and more generally a computation graph, includes multiple operations and data flowing between the multiple operations. Some operations may be performed in parallel, i.e., at the same time, whereas other operations must be performed sequentially, for example when the input data of an operation depends on the result of an earlier operation. A meta-pipeline may include a sequence of compute operations that, because of their dependencies, need to be performed in successive timesteps. Within each timestep, there may be parallel operations. (Note that a meta-pipeline is a pipeline at the graph level, and is different than a processor-level pipeline which is used for enabling synchronous logic, clocked by a processor clock. A timestep in a meta-pipeline may have a duration of multiple processor clock cycles, and may not even be a fixed number of processor clock cycles.) A meta-pipeline stage performs one or more parallel compute operation in one timestep. Some compute operations in a meta-pipeline stage may depend only on results from a directly prior meta-pipeline stage. Other compute operations depend on one or more results from the directly prior meta-pipeline stage, as well as one or more results from an earlier meta-pipeline stage. In those cases, the data from the earlier meta-pipeline stage needs to be synchronized with the data from the directly prior meta-pipeline stage. This is performed in a buffer. A buffer that stores data to skip more than two timesteps, i.e., more than two meta-pipeline stages, is called a "skip buffer".

In case the data that is moved includes a tensor, the buffer's memory needs may be larger than can be implemented in a single memory unit. Additionally, there may be a need to buffer and shift multiple tensors. A skip buffer may store, for example, three or more tensors, and forward them in a first-in, first-out (FIFO) fashion. Some buffers may have a fixed depth (i.e., the number of tensors stored), and others may have a variable depth. Some buffers may be written and read synchronously, others may be written and read asynchronously. Dependent on a buffer's particular requirements and the size of tensors to be stored, it may be implemented in a single memory unit, or it may require multiple memory units. In case of multiple memory units, a compiler implementation must decide on the best topology. FIGS. 10, 12-14 illustrate several buffer topologies.

FIG. 10 shows an example buffering system 1000 that implements a buffer in a series or "cascade" of memory units. A buffer implementation in a series of memory units, or a series of PMUs, is sometimes called a cascaded buffer. Buffering system 1000 shows a buffer that receives data from producer 1020, to be delayed for usage by consumer 1030. The buffer is implemented in a series of memory units 1010. The data may include a tensor, a vector, a scalar, etc. Dependent on hardware limitations, in some implementations a tensor can be as large as a memory unit. Other implementations can store less, for example a tensor can be up to half the size of a memory unit. Hardware limitations may be related to performance, congestion, bank conflicts, network latency, etc. In some implementations, data may move through the cascade, whereas in other implementations the data is written and read only once, but write instructions and read instructions track where to write or read the next tensor. In an ALN that has unpredicted latencies, an implementation may move data, whereas in an ALN with known latencies, it may be easier to rotate write and read pointers. An advantage of the buffer implementation in buffering system 1000 is that if there is a single producer 1020 and a single consumer 1030, no "reorder buffer" is needed. A reorder buffer is a buffer used to ensure that data moved through the ALN and subsequent buffer stages is presented to the consumer in the correct order. In a cascaded buffer topology, all memory units can be used for delaying the buffered data.

FIG. 11 illustrates data movement in an example cascaded buffer 1100. This example shows a buffer with depth 4 (i.e., it delays tensors by four timesteps). The size of the tensor is one half of the size of a memory unit. The buffer uses three memory units, arranged in three successive sections of each one memory unit. Each memory unit has two memory regions, for example banks, which may be written into and read from independently. Data may move through an ALN that has unpredicted latency. Yet, the data arrives at the consumer in the order that it was delivered by the producer. At time t=1 (time 1110), the producer delivers a first tensor A and writes it (wA) into the first memory region of the first memory unit. At time t=2 (time) 1120), the producer delivers a second tensor B and writes it (wB) into the second memory region of the first memory unit. Simultaneously, the first memory unit reads tensor A (rA) and sends it to the second memory unit, which writes it into its first memory region. At time t=3 (time 1130), the producer delivers a third tensor C and writes it (wC) into the first memory region of the first memory unit. Simultaneously, the second tensor B is read from the first memory unit and written into the second memory unit, and the first tensor A is read from the second memory unit and written into the third memory unit. At time t=4 (time 1140), the producer delivers a fourth tensor D and writes it (wD) into the first memory units. The consumer receives the first tensor A from the third memory unit. The other tensors move through the successive sections.

A disadvantage of the buffer topology in this example is that the number of memory units is relatively large, and apart from the oldest and the newest tensors, all tensors in between occupy two memory regions. Because all data moves at each timestep, the implementation has relatively high bandwidth needs, uses relatively much power, and may cause ALN congestion.

FIG. 12 shows an example buffer 1200 implemented in multiple parallel memory units. This implementation topology is also known as a striped buffer. Example buffer 1200 shows a buffer that receives data from producer 1220, to be delayed for usage by consumer 1230. A number of parallel memory units 1210 implement the buffer. The data may include a tensor, a vector, a scalar, etc. Implementations may divide a tensor over several or all the parallel memory units 1210, practically removing any restrictions on the size of the tensor (but limiting the attainable buffer depth). A reorder buffer 1219 ensures that consumer 1230 receives tensors or partial tensors in the correct order. An advantage of this topology is that data is written and read only once. It has far fewer write and read actions than a cascaded buffer and can consume less energy. However, the data provided by producer 1220 may have to be routed to all parallel memory units 1210 at once, which carries a relatively heavy cost of data transfer, and which may cause a PNR problem in case of large fan-in. The data transferred from parallel memory units 1210 to reorder buffer 1219 may suffer less from this problem, as all data only needs to travel a dedicated path.

FIG. 13 shows an example buffer 1300 implemented in a hybrid topology of memory units. A producer 1320 delivers tensors or other data for consumer 1330. The data is stored in a first section that includes parallel memory units 1310 and memory unit 1314 acting as a reorder buffer, and a second section that includes parallel memory units 1315 and memory unit 1319 acting as a reorder buffer. This topology combines advantages and disadvantages of the cascaded buffer and the striped buffer, and in some cases results in a lower total cost factor. Implementations of this topology may have two or more sections, where each section includes two or more parallel memory units with one memory unit for a reorder buffer. The cost factor is dependent on limitations and capabilities of the memory units as well as the ALN that moves the data from producer 1320 to consumer 1330 via the memory units.

FIG. 14 shows an example buffer 1400 implemented in another hybrid topology of memory units. The topology is similar to the topology of example buffer 1300, but sections don't include a memory unit for a reorder buffer. A producer 1420 delivers tensors or other data for consumer 1430. The data is stored in the first section in parallel memory units 1410, and in the second section in parallel memory units 1415. An implementation may have two or more sections (only two are drawn). Data travels directly from memory units in one section to adjacent memory units in the next section, without intervening reorder buffers. After the final section (here parallel memory units 1415), reorder buffer 1419 reassembles the data and presents it to consumer 1430 in the correct order. Again, this topology combines advantages and disadvantages of the cascaded buffer and the striped buffer, and in some cases results in a lower total cost factor. In many cases, its cost factor may be lower than when using the topology of FIG. 13. Implementations of this topology may work with sections of two or more parallel memory units. The cost factor is dependent on limitations and capabilities of the memory units as well as the ALN that moves the data from producer 1420 to consumer 1430 via the memory units.

To calculate and compare cost factors related to candidate topologies as in FIG. 10, FIG. 12, FIG. 13, and FIG. 14, an implementation may look at the number of memory units used for the FIFO action and for reordering, as well as the number of times a tensor is written (copied). In a cascaded buffer, the tensor is written once in every memory unit it passes, such as described with reference to FIG. 11. In a striped buffer the tensor is written just once. In a hybrid buffer, the tensor may be written once every section it passes. In some implementations, fan-in and fan-out are taken as a cost factor, whereas other implementations may just limit the fan-in and fan-out. Further implementations may use the following heuristic formula:

$$Cost = memorycount*memoryweight + copies*copyweight$$

wherein memorycount stands for the number of memory units used in the implementation topology, and copies stands for the number of times the data is written into a memory unit while traveling through the buffer.

FIG. 15 shows pseudocode for an example method of determining a buffer implementation topology. The method is given in the routine pick_split( ) in lines 28-50. The method receives Buffer information as its input parameter, where the Buffer information includes Buffer.depth( ) and Buffer.bytes_per_tensor( ). The routine relies on a few support functions, including count_fanin_fanout( ) in lines 1-3, count_copies( ) in lines 5-7 and get_section_depths_for_split( ) in lines 12-26. The routine further relies on information regarding the physical implementation of the buffers, i.e., information about the CGR array in which the buffer is implemented. This information includes BYTES_PER_PMU, SKIP_BUFFER_MAX_DEPTH, SKIP_BUFFER_MAX_FANIN, SKIP_BUFFER_PMU_WEIGHT (for the cost function), and SKIP_BUFFER_COPIES_WEIGHT (also for the cost function).

Line 29 calculates the depth per memory unit (depth_per_pmu) by rounding down (floor( ) the number of bytes in a memory unit divided by the number of bytes in a tensor. Lines 30-32 calculate the range of depths that the routine considers. Lines 33-34 initialize parameters for the best depth and the minimum cost. Lines 35-49 iterate the range of considered depths to determine the lowest cost factor.

For each depth, the routine collects topology information in line 36 by calling get_section_depths_for_split( ). This function takes the target depth, which is the Buffer.depth( ), and the considered depth per stage or cascade (each_depth). It determines the fan-in and fan-out in line 37 by calling count_fanin_fanout( ). When the fan-in gets too high, the routine exits the loop in line 39-40, and returns the best depth it has found (line 50). As long as the fan-in doesn't exceed the maximum defined by SKIP_BUFFER_MAX_FANIN, the routine proceeds and calculates the cost in lines 41-44. If the cost is lower than the minimum cost found before (min_cost, line 45), then it updates the minimum cost and best depth (lines 46-47).

An implementation may use the method reflected in the pseudo code initially on the cascaded buffer topology (lowest fan-in), followed by the hybrid buffer topology of FIG. 14 (higher fan-in), and ending with the striped buffer topology (highest fan-in). This will gradually increase the fan-in, so that the routine doesn't terminate prematurely. Also, by increasing the depth per stage (each_depth), the number of memory units will never go down.

The get_section_depths_for_split( ) function (lines 12-26) provides information related to an implementation in one of the topologies. Its input arguments include the buffer's target depth, and the candidate stage depth (split_depth). Except for the last section, each section has an effective depth that is one less than its actual depth to avoid stalling the upstream provider, as was shown with reference to FIG. 11. Line 11 calculates the effective depth. Line 17 calculates the number of sections needed to implement the buffer, and stores the result in the info output structure as info.full_section_bufs. Line 18 calculates the full effective depth of the implemented buffer (full_effective_depth). In lines 20-25 it calculates the partial depth and stores the result in info.partial_depth. The function returns the info structure in line 26.

Further or Additional Considerations

We describe various implementations of a computer-implemented method for determining an optimum topology for the physical implementation of a skip buffer in an array of reconfigurable units to allow parallel asynchronous computation pipelines to interact at the lowest technical and economic cost. The method can be used in a compiler that translates high-level computer programs and dataflow graphs into executable configuration data that programs and initializes a coarsely reconfigurable processor.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the implementations described herein.

Although the description has been described with respect to particular implementations thereof, these particular implementations are merely illustrative, and not restrictive. The description may reference specific structural implementations and methods, and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. For instance, many of the operations can be implemented in a CGRA system, a System-on-Chip (SoC), application-specific integrated circuit (ASIC), programmable processor, in a programmable logic device such as a field-programmable gate array (FPGA) or a graphics processing unit (GPU), obviating a need for at least part of the dedicated hardware. Implementations may be as a single chip, or as a multi-chip module (MCM) packaging multiple semiconductor dies in a single package. All such variations and modifications are to be considered within the ambit of the present disclosed technology the nature of which is to be determined from the foregoing description.

One or more implementations of the technology or elements thereof can be implemented in the form of a computer product, including a non-transitory computer-readable storage medium with computer usable program code for performing any indicated method steps and/or any configuration file for one or more RDUs to execute a high-level program. Furthermore, one or more implementations of the technology or elements thereof can be implemented in the form of an apparatus including a memory and at least one processor that is coupled to the memory and operative to perform exemplary method steps, and/or an RDU that is operative to execute a high-level program based on a configuration file. Yet further, in another aspect, one or more implementations of the technology or elements thereof can be implemented in the form of means for carrying out one or more of the method steps described herein and/or executing a high-level program described herein. Such means can include (i) hardware module(s); (ii) software module(s) executing on one or more hardware processors; (iii) bit files for configuration of an RDU; or (iv) a combination of aforementioned items.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit of the technology disclosed.

What is claimed is:

1. A computer-implemented method to transform a high-level program into configuration data for a coarse-grained reconfigurable (CGR) processor with an array of CGR units, comprising:
- transforming at least a part of the high-level program into a dataflow graph that includes multiple interdependent asynchronously performing meta-pipelines, wherein at least one of the meta-pipelines includes a nested loop;
- in the dataflow graph, identifying a first buffer that stores data that is passed from a producer in a first meta-pipeline stage to a consumer in a second meta-pipeline stage, wherein the first buffer has a first depth and the first depth is more than two timesteps;
- determining hardware limitations associated with the array of CGR units, including one or more of a number of bytes in a memory unit, a maximum depth of a buffer, or a maximum fan-in of a buffer;
- determining a lowest cost implementation topology and stage depth, based on a size of the data, the first depth, the hardware limitations, and one or more of three topologies, the three topologies including a cascaded buffer topology, a hybrid buffer topology, and a striped buffer topology;
- assigning the first buffer to memory units and communication channels according to the lowest cost implementation topology and stage depth;
- generating configuration data for the assigned memory units and communication channels, wherein the configuration data, when loaded onto an instance of the array of CGR units, causes the array of CGR units to implement the dataflow graph; and
- storing the configuration data in a non-transitory computer-readable storage medium.

2. The computer-implemented method of claim 1, wherein:
- the hybrid buffer topology includes multiple sections that include parallel memory units; and
- the data travels from memory units in one to adjacent memory units in a next section without intervening reorder buffers.

3. The computer-implemented method of claim 1, wherein:
- determining a lowest cost implementation topology and stage depth includes calculating a cost based on a number of memory units and based on a number of times the data is written into a memory unit while traveling through the first buffer.

4. The computer-implemented method of claim 3, wherein the cost factor includes a weight for the number of memory units and/or a weight for the number of times the data is written into a memory unit while traveling through the first buffer.

5. A non-transitory computer-readable storage medium storing computer program instructions to transform a high-level program into configuration data for a CGR processor with an array of CGR units, wherein the computer program instructions, when executed on a processor, implement a method comprising:
- transforming at least a part of the high-level program into a dataflow graph that includes multiple interdependent asynchronously performing meta-pipelines, wherein at least one of the meta-pipelines includes a nested loop;
- in the dataflow graph, identifying a first buffer that stores data that is passed from a producer in a first meta-pipeline stage to a consumer in a second meta-pipeline stage, wherein the first buffer has a first depth and the first depth is more than two timesteps;
- determining hardware limitations associated with the array of CGR units, including one or more of a number of bytes in a memory unit, a maximum depth of a buffer, or a maximum fan-in of a buffer;
- determining a lowest cost implementation topology and stage depth, based on a size of the data, the first depth, the hardware limitations, and one or more of three topologies, the three topologies including a cascaded buffer topology, a hybrid buffer topology, and a striped buffer topology;
- assigning the first buffer to memory units and communication channels according to the lowest cost implementation topology and stage depth;
- generating configuration data for the assigned memory units and communication channels, wherein the configuration data, when loaded onto an instance of the array of CGR units, causes the array of CGR units to implement the dataflow graph; and
- storing the configuration data in a non-transitory computer-readable storage medium.

6. A system including one or more processors coupled to a memory, the memory loaded with computer program instructions to transform a high-level program into configuration data for a CGR processor with an array of CGR units, wherein the computer program instructions, when executed on the one or more processors, implement actions comprising:
- transforming at least a part of the high-level program into a dataflow graph that includes multiple interdependent asynchronously performing meta-pipelines, wherein at least one of the meta-pipelines includes a nested loop;
- in the dataflow graph, identifying a first buffer that stores data that is passed from a producer in a first meta-pipeline stage to a consumer in a second meta-pipeline stage, wherein the first buffer has a first depth and the first depth is more than two timesteps;
- determining hardware limitations associated with the array of CGR units, including one or more of a number of bytes in a memory unit, a maximum depth of a buffer, or a maximum fan-in of a buffer;
- determining a lowest cost implementation topology and stage depth, based on a size of the data, the first depth, the hardware limitations, and one or more of three topologies, the three topologies including a cascaded buffer topology, a hybrid buffer topology, and a striped buffer topology;
- assigning the first buffer to memory units and communication channels according to the lowest cost implementation topology and stage depth;
- generating configuration data for the assigned memory units and communication channels, wherein the configuration data, when loaded onto an instance of the array of CGR units, causes the array of CGR units to implement the dataflow graph; and
- storing the configuration data in a non-transitory computer-readable storage medium.

* * * * *